United States Patent [19]

Merchant et al.

[11] Patent Number: 5,537,357

[45] Date of Patent: Jul. 16, 1996

[54] METHOD FOR PRECONDITIONING A NONVOLATILE MEMORY ARRAY

[75] Inventors: Amit Merchant, Portland, Oreg.; Mickey L. Fandrich, Placerville; Geoffrey Gould, El Dorado Hills, both of Calif.

[73] Assignee: Intel Corporation, Santa Clara, Calif.

[21] Appl. No.: 266,132

[22] Filed: Jun. 27, 1994

[51] Int. Cl.$^6$ ........................................ G11C 7/02
[52] U.S. Cl. ................ 365/218; 365/185.22; 365/185.29
[58] Field of Search ........................ 365/218, 900, 365/185, 104, 230.03, 185.22, 185.29

[56] References Cited

U.S. PATENT DOCUMENTS

| | | |
|---|---|---|
| 4,357,685 | 11/1982 | Daniele et al. . |
| 4,460,982 | 7/1984 | Gee et al. . |
| 4,811,294 | 3/1989 | Kobayashi et al. . |
| 5,034,922 | 7/1991 | Burgess . |
| 5,043,940 | 8/1991 | Harari . |
| 5,053,990 | 10/1991 | Kreifels et al. . |
| 5,172,338 | 12/1992 | Mehrotra . |
| 5,327,383 | 7/1994 | Merchant et al. ........................ 365/218 |
| 5,347,490 | 9/1994 | Terada et al. ............................ 365/218 |

Primary Examiner—David C. Nelms
Assistant Examiner—Vu A. Le
Attorney, Agent, or Firm—Blakely, Sokoloff, Taylor & Zafman

[57] ABSTRACT

A method of preconditioning a nonvolatile memory array including a first memory cell and a second memory cell. Preconditioning begins by applying an initial precondition pulse to all memory cells in the nonvolatile memory array without pausing to perform precondition verification. After this first step, precondition verification begins. The voltage level of the first memory cell is sensed and compared to a selected voltage level. If the threshold voltage of the first memory cell is below the selected voltage, the first memory cell did not precondition verify. In that case, another precondition pulse is then applied to the first memory cell. Application of precondition pulses and precondition verification continues until the first memory cell verifies as preconditioned. Attention turns to the second memory cell after the first memory cell precondition verifies. If the second memory cell does not precondition verify another precondition pulse is applied to the second memory cell. Application of precondition pulses and precondition verification continues until the second memory cell verifies as preconditioned.

8 Claims, 8 Drawing Sheets

METHOD FOR PRECONDITIONING A NONVOLATILE MEMORY ARRAY

FIELD OF THE INVENTION

The present invention relates to the field of nonvolatile semiconductor memories. More particularly, the present invention relates to a method for preconditioning a nonvolatile memory array.

BACKGROUND OF THE INVENTION

One type of prior non-volatile semiconductor memory is flash electrically erasable programmable read-only memory ("flash memory"). Flash memory can be programmed by a user, and once programmed, the flash memory retains its data until erased. After erasure, the flash memory may be programmed with new data.

Flash memories differ from conventional electrically erasable programmable read only memory ("EEPROMs") with respect to erasure. Conventional EEPROMs typically use a select transistor for individual byte erase control. Flash memories, on the other hand, typically achieve much higher density with single transistor cells. Flash memories typically achieve faster erase speeds by erasing all memory cells in a memory array simultaneously.

According to flash terminology, a logical "one" means that few if any electrons are stored on a floating gate associated with a bit cell. A logical "zero" means that many electrons are stored on the floating gate associated with the bit cell. Erasure of a flash memory cell causes it to store a logical one. A flash memory cell can only be written from a logical zero to a logical one by erasure of the entire array. Memory cells can, however, be individually overwritten from a logical one to a logical zero, given that this entails simply adding electrons to a floating gate.

One prior flash memory is the 28F008 CMOS flash memory sold by Intel Corporation of Santa Clara, Calif. The 28F008 is an eight megabit flash memory, which incorporates a prior write state machine. The prior write state machine automatically programs and erases the array upon receipt of a two stage command from the command port. In response to an erase command, the prior write state machine performs two major tasks: array preconditioning and array erasure. Preconditioning the nonvolatile memory array brings memory cell threshold voltages to a minimum level of approximately 5.3 volts, representative of a logic zero, and prolongs the longevity of the nonvolatile memory array by preventing cell threshold voltages from dropping to levels during erasure that could result in memory cell leakage. Preconditioning is performed much like programming. That is, preconditioning is performed by applying approximately 12 volts to memory cell gates, 5–7 volts to memory cell drains, and grounding memory cell sources.

FIG. 1 illustrates in flow diagram form a prior method of preconditioning a nonvolatile memory array, which was implemented by the prior write state machine of the 28F008. According to the prior method a group of memory cells, typically a byte, is selected for preconditioning and is operated upon until the selected group of memory cells verifies as preconditioned. In other words, the selected group of memory cells is always verified immediately after application of a precondition pulse. If the selected group of memory cells do not verify as being preconditioned, then another precondition pulse is immediately applied to that group of memory cells. When the selected group of memory cells verifies, another group of memory cells is selected for preconditioning. This process requires frequently pausing while voltage levels applied to the nonvolatile memory array slew (i.e., ramp or change) between high precondition levels and lower verify levels. Given that a block of memory may include 64 Kbytes of data, much erase time is attributable to voltage level slewing during preconditioning. In the prior 28F008 flash memory, preconditioning alone can consume up to approximately 40% of the approximately one second block erase time.

SUMMARY AND OBJECTS OF THE INVENTION

One object of the present invention is to help to increase the efficiency of programming and erasing a nonvolatile memory array.

Another object of the present invention is to help to reduce the time spent preconditioning a nonvolatile memory array.

A method of preconditioning a nonvolatile memory array, which includes a first memory cell and a second memory cell, is described. Preconditioning is a multi-step process that begins by applying an initial precondition pulse to all memory cells in the nonvolatile memory array without pausing to perform precondition verification. After this first step precondition verification begins. Precondition verification involves sensing the voltage level of the first memory cell and comparison to a selected voltage level. If the threshold voltage of the first memory cell is below the selected voltage, the first memory is not preconditioned and is said to not precondition verify. Another precondition pulse is then applied to the first memory cell. Application of precondition pulses and precondition verification continues until the first memory cell verifies as preconditioned. When the first memory cell precondition verifies, attention turns to the second memory cell. If the second memory cell does not precondition verify in response to initial precondition pulse another precondition pulse is applied to the second memory cell. Application of precondition pulses and precondition verification continues until the second memory cell also verifies as preconditioned.

Other objects, features, and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

Figure 1:
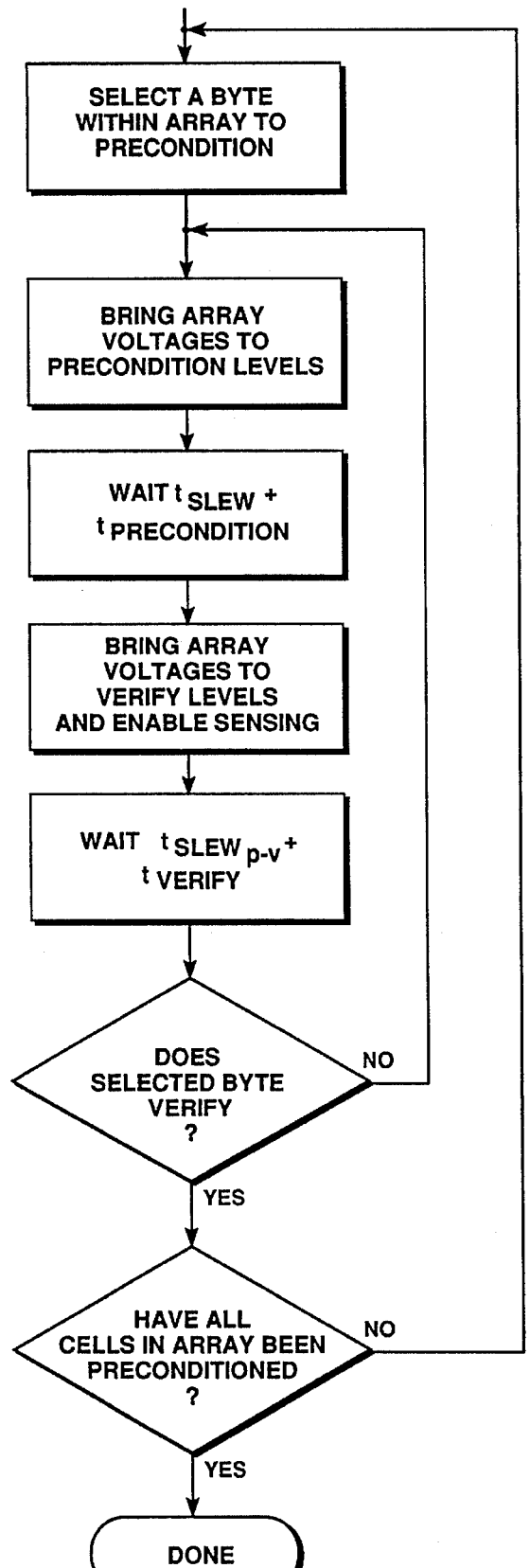
FIG. 1 is a flow diagram of a prior method of preconditioning a nonvolatile memory array.
Figure 2:
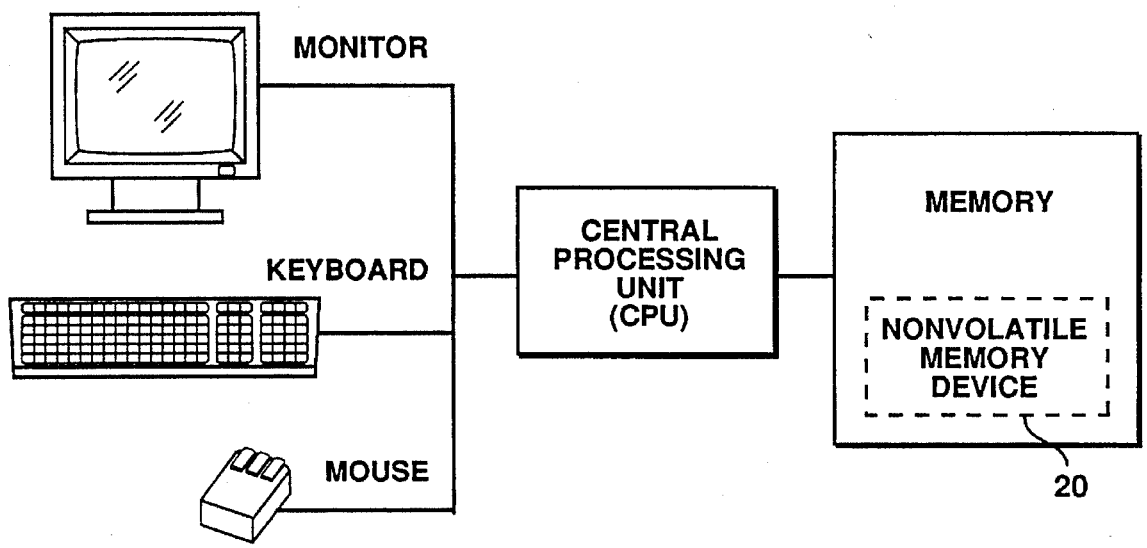
FIG. 2 is a block diagram of a personal computer.

FIG. 2 illustrates in block diagram form a computer system. The computer system includes a central processing unit ("CPU") and a monitor for visually displaying information to a computer user. A keyboard allows the computer user to input data to the CPU. By moving a mouse the computer user is able to move a pointer displayed on the monitor. Memory stores data used by the CPU. Nonvolatile semiconductor memory device 20 is one type of memory accessed by the CPU.

Figure 3:
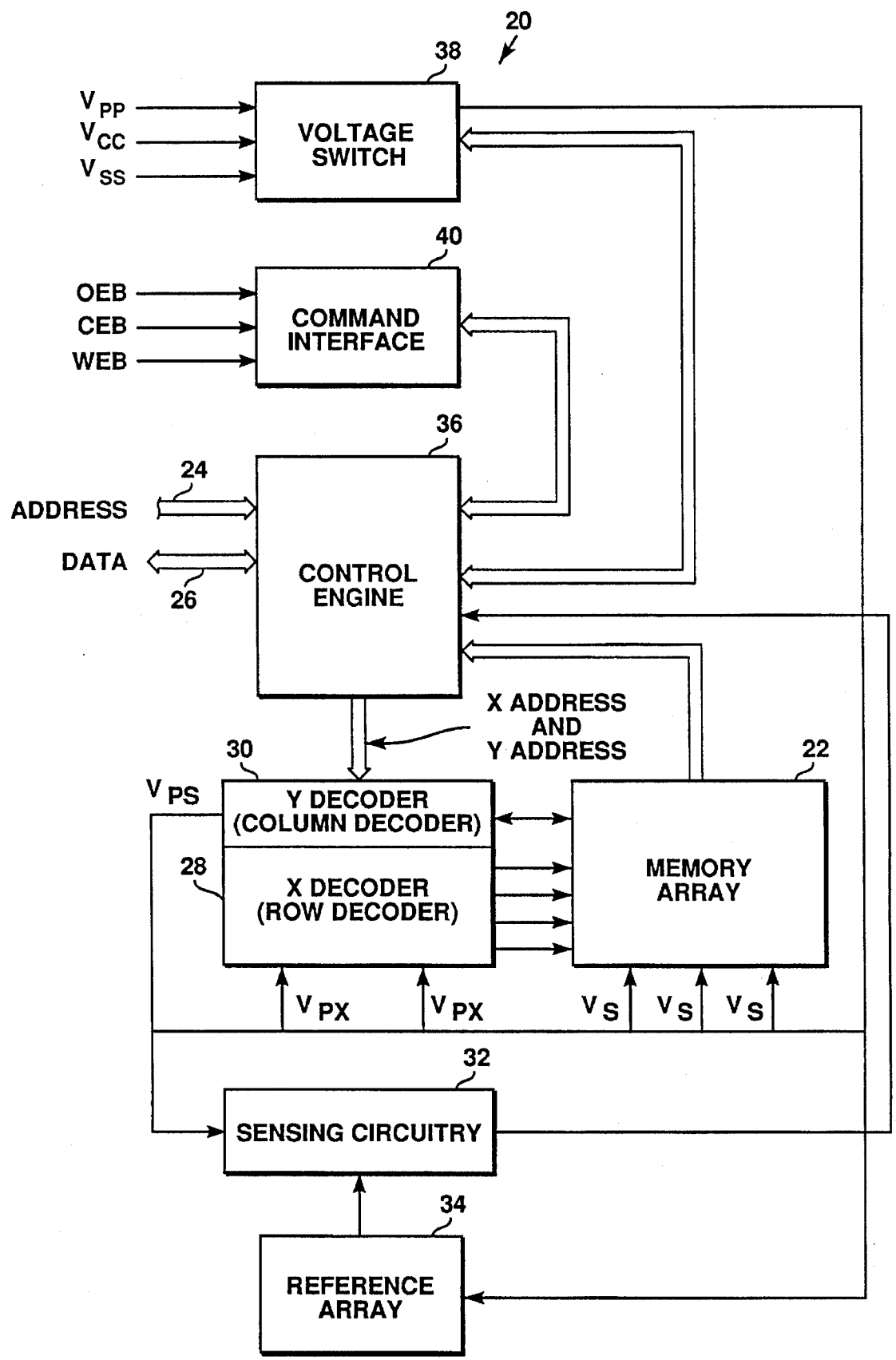
FIG. 3 is a block diagram of a nonvolatile memory device.

FIG. 3 illustrates in block diagram form nonvolatile memory device 20, which is fabricated on a single semiconductor substrate. Memory device 20 stores data using nonvolatile memory cells within memory array 22. For one embodiment, memory array 22 is divided into blocks of memory cells. Each block is treated as a self-contained array of memory cells. For an alternative embodiment, memory array 22 comprises a single memory array without separate blocks.

Preconditioning the memory cells of nonvolatile memory array 22 will be described in more detail herein below. Applying an initial precondition pulse to each memory cell of memory array 22 prior to beginning precondition verification helps to reduce the time required to precondition memory array 22.

I. Memory Device Overview

Consider the memory device 20 to which the present method of preconditioning is applied. $V_{PP}$ is the erase/program power supply for memory device 20. In the absence of a high voltage level on the memory cells, memory device 20 acts as a read only memory. The data stored at an address indicated by address lines 24 is read from memory array 22 and is output to the external user via data lines 26.

X decoder 28 selects the appropriate row within memory array 22 in response to address signals applied to address lines 24. For this reason, X decoder 28 is also called row decoder 28. Similarly, Y decoder 30 selects the appropriate column within memory array 22 in response to address signals from address lines 24. Because of its function, Y decoder 30 is also called column decoder 30.

Data output from memory array 22 is coupled to Y decoder 30, which passes the data on to sensing circuitry 32. Sensing circuitry 32 determines the state of data presented to it using reference array 34. Sensing circuitry also indicates whether a group of memory cells is preconditioned via a match signal, which is coupled to control engine 36.

Control engine 36 controls the preconditioning, erasure, and programming of memory array 22. Control engine 36 includes a microprocessor that is controlled by microcode stored in on-chip memory. However, the particular implementation of control engine 36 does not affect the present method of preconditioning.

Control engine 36 manages memory array 22 via control of row decoder 28, column decoder 30, sensing circuitry 32, reference array 34 and voltage switch 38.

Voltage switch 38 controls the various voltage levels necessary to read, program, and erase memory array 22. $V_{CC}$ is the device power supply and $V_{SS}$ is ground. $V_{PP}$ is the program/erase voltage, which must be high in order to program or erase data stored within memory array 22. $V_{PP}$ may be externally supplied or internally generated.

User commands for reading, erasing, and programming are communicated to control engine 36 via command interface 40. The external user issues commands to command interface 40 via three control pins: output enable OEB, write enable WEB, and chip enable CEB.

II. The Nonvolatile Memory Array

Figure 4:
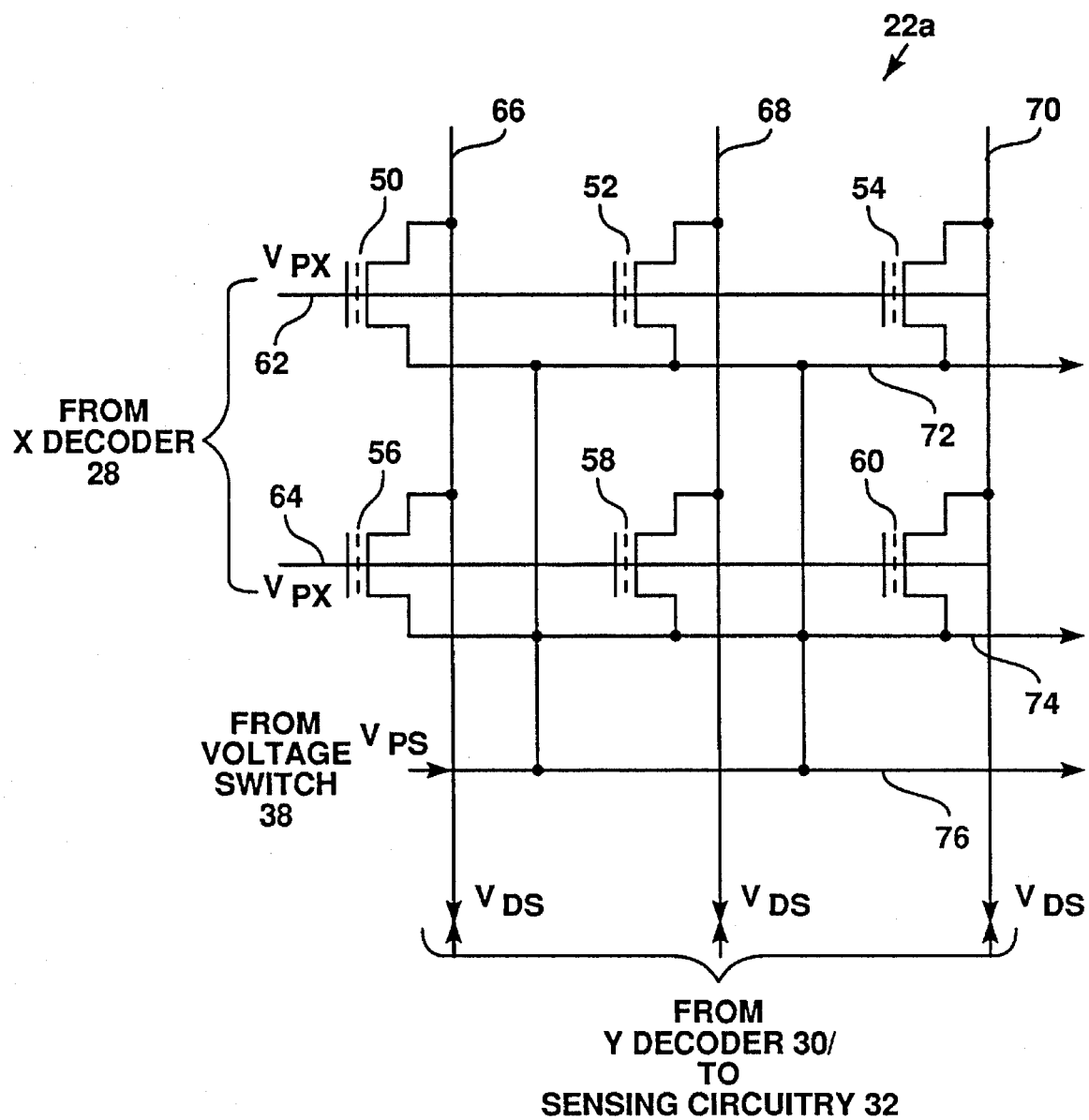
FIG. 4 is a schematic diagram of a portion of a nonvolatile memory array.

FIG. 4 illustrates in detail a portion 22a of memory array 22. Portion 22a includes six single field effect transistor floating gate flash memory cells 50, 52, 54, 56, 58, and 60. This type of memory cell is shown solely for illustration purposes. Other types of memory cells may also be preconditioned using the present method. For example, multiple transistor memory cells and memory cells that use a trapping dielectric to shift the threshold voltage of the memory cells may both be preconditioned using the present method.

Memory cells 50, 52, 54, 56, 58, and 60 are formed at the intersections of wordlines 62 and 64 and bitlines 66, 68, and 70. Wordlines 62 and 64 are also referred to as X lines or row lines. This is because each wordline is coupled to X decoder 28. Each wordline is also coupled to all memory cell gates in a particular row. For example, wordline 62 is coupled to the gates of memory cells 50, 52, and 54. Bitlines 66, 68, and 70 are also referred to as Y lines or column lines because they are coupled to Y decoder 30. Each bitline is coupled to all memory cell drains in a particular column. For example, bitline 68 is coupled to the drains of memory cells 52 and 58. The sources of all memory cells in a row are coupled to a local source line. The sources of memory cells 50, 52, and 54 are coupled to local source line 72, while the sources of memory cells 56, 58 and 60 are coupled to local source line 74. Local source lines 72 and 74 are also coupled to common source line 76, which is coupled to voltage switch 38. Common source line 76 thus provides a mechanism for applying voltages to the sources of all memory cells within a block of memory array 22.

Together the bitlines, wordlines, and the common source line provide a means of applying to the memory cells the voltages necessary for programming, preconditioning, erasing, and reading memory cells within array 22. Memory cells 50, 52, 54, 56, 58, and 60 are programmed and preconditioned via hot electron injection by applying a source voltage $V_{PS}$ to common source line 76, applying a drain voltage $V_{DS}$ to bitlines 66, 68, and 70 such that the bitline voltage level is 5–7 volts above source line 76; i.e., setting $V_{DS}$ to 5–7 volts, and applying a voltage $V_{PX}$ to the cell gates via wordlines 62 and 64 sufficient to change the amount of charge stored by the memory cells being preconditioned. Other voltage levels also can be used to precondition and program memory cells. As used herein, "a precondition pulse" refers to the combination of voltages applied to the bitline, sourceline, and wordline of a memory cell to shift the memory cell threshold voltage by changing the amount of charge stored in the memory cell. Memory cells are read in response to a user command and during precondition verification by applying one to seven volts to wordlines 62 and 64, approximately one volt to bitlines 66, 68, and 70, and zero volts to common source line 76, while sensing the current flowing through each memory cell.

A group of memory cells are selected for preconditioning and precondition verification by coordinating the control of wordline and bitline voltages. To illustrate, assume that memory cell 50 is to be preconditioned. The gate voltage for memory cell 50 is brought to, and held at, the appropriate voltage level via wordline 62, which also applies the same voltage to the gate of memory cells 52 and 54. Local source line 72 applies the same voltage to the sources of all three memory cells. Memory cell 50 is preconditioned by pulsing the voltage on its drain by pulsing the voltage on bitline 66, while bitlines 68 and 70 are held near ground and wordline 62 is held at a high enough voltage to develop a desired electric field across the gate oxide of memory cell 50. Thus, only memory cell 50 is preconditioned. The duration of a preconditioned pulse within memory array 22 is controlled by the duration of the high voltage on the selected bitline, that is to say, by the drain voltage. Bringing the voltage applied to the selected bitline down to ground halts the precondition pulse.

The same effect can alternatively be achieved by controlling the duration of the high voltage on the selected wordline—that is to say, the gate voltage—and holding the bitline at the appropriate voltage level.

III. Preconditioning the Nonvolatile Memory Array

The embodiments of the present invention for preconditioning help to reduce the total time required to precondition memory array 22 by taking advantage of the fact that preconditioning brings each memory cell in nonvolatile memory array 22 to approximately the same threshold voltage. Consequently, an initial precondition pulse can be applied to each memory cell in nonvolatile memory array 22 prior to beginning precondition verification. This reduces time delay associated with constantly stewing (i.e., ramping or changing) between precondition voltage levels and precondition verify voltage levels. For example, the time required to precondition a 64 Kbyte block of memory can be reduced to approximately 130–145 milliseconds using the present method.

Figure 5:
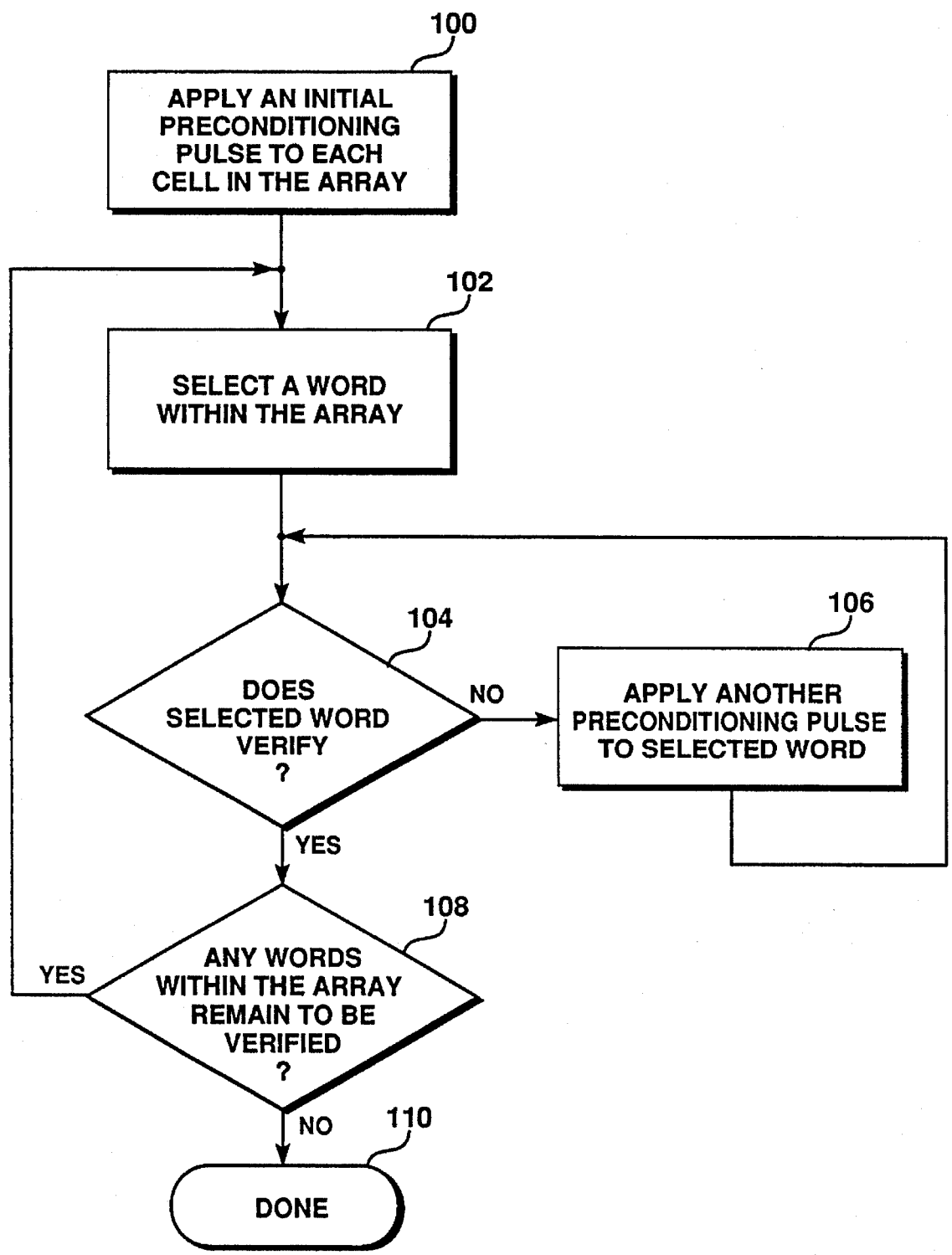
FIG. 5 is a flow diagram of a method of preconditioning a nonvolatile memory array.

FIG. 5 gives an overview in flow diagram form of one method of preconditioning, which is stored in and executed by control engine 36. During step 100, control engine 36 begins preconditioning by applying an initial precondition pulse to each memory cell of memory array 22 that is to be preconditioned. For one embodiment, memory array 22 is made up of several blocks of memory cells, and each block is to be preconditioned. Each block is treated as a self-contained array of memory cells. For another embodiment of the present invention, any portion or subset either of a block or of an array is to be preconditioned. For yet another alternative embodiment, memory array 22 comprises a single memory array without separate blocks.

The method shown in FIG. 5 helps to produce time savings because all memory cells receive an initial precondition pulse without slewing (i.e., ramping or changing) between verify and precondition voltage levels.

Control engine 36 goes from step 100 to step 102 to begin the process of precondition verification and applying additional precondition pulses, if necessary. During step 102 control engine 36 selects for verification a group of memory cells, for example a word, by addressing the selected group of memory cells. During the following step, step 104, control engine 36 determines whether the addressed memory cells verify as being preconditioned. Control engine 36 selects its next action based upon that determination.

Control engine 36 branches to step 106 from step 104 if the preceding precondition pulses did not bring the threshold voltages of the addressed memory cells of the memory word to, or above, the level representative of the preconditioned state. During step 106, control engine 36 applies another precondition pulse or pulses to the addressed memory cells that have not correctly verified. At step 106, the addressed memory cells that did correctly verify at step 104 are not provided with an additional precondition pulse or pulses.

Control engine 36 then returns to step 104 to determine whether the last precondition pulse or pulses brought the threshold voltages of the addressed memory cells to, or above, the selected voltage level.

Control engine 36 branches through steps 104 and 106 until all of the addressed memory cells verify as preconditioned.

When all of the addressed memory cells verify as preconditioned, control engine 36 advances to step 108 from step 104.

During state 108 control engine 36 determines whether any additional groups of memory cells within memory array 22 need to be verified. If so, control engine 36 branches back to step 102 to select and address another group of memory cells for precondition verification. Afterward control engine 36 branches through steps 104, 106, 108, and 102 as described above until all the groups of memory cells that are to be preconditioned have been preconditioned—i.e., until all cells within memory array 22 that are to be preconditioned have been preconditioned.

A further reduction in preconditioning time can be achieved by eliminating, or reducing, voltage level slewing during precondition verification and reapplication of precondition pulses. Doing so requires a scratch pad memory to store precondition verification results for multiple groups of memory cells. For this alternative embodiment, voltage levels remain at precondition verify levels for a prolonged period before slewing to precondition levels. Similarly, precondition pulses are reapplied to several groups of memory cells before slewing from precondition voltage levels to verify voltage levels. In other words, for this alternative embodiment, there is verification for word one, verification for word two, etc., through verification for word N (wherein N is an integer greater than 2), followed by preconditioning of word one, preconditioning of word two, etc., through preconditioning of word N. This alternative embodiment reduces the repetitive slewing between verification and preconditioning caused by verifying and preconditioning word one, verifying and preconditioning word two, etc., through verifying and preconditioning word N.

Figure 6A:
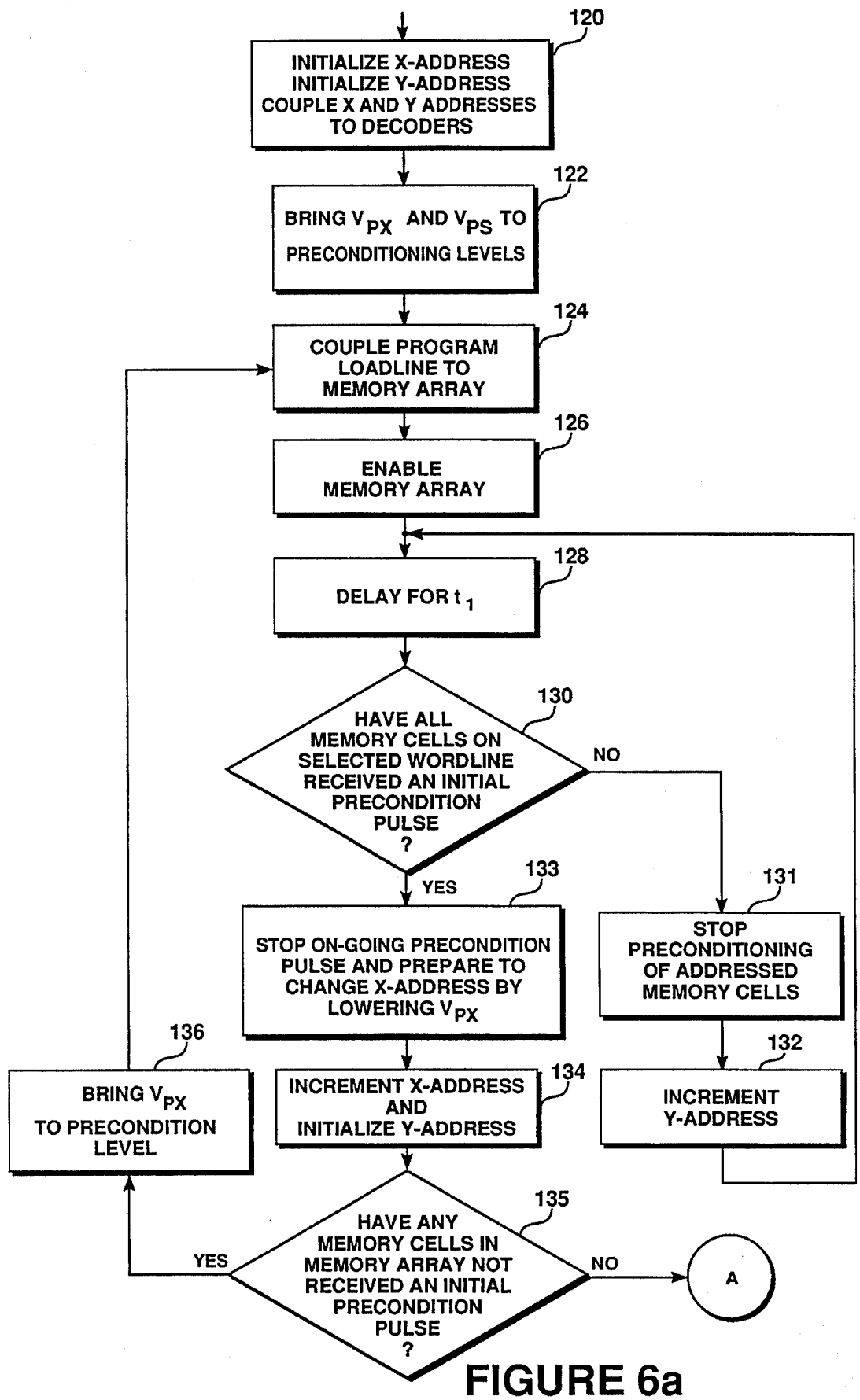
FIGS. 6a, 6b, and 6c show a detailed flow diagram of a method of preconditioning a nonvolatile memory array.
Figure 6B:
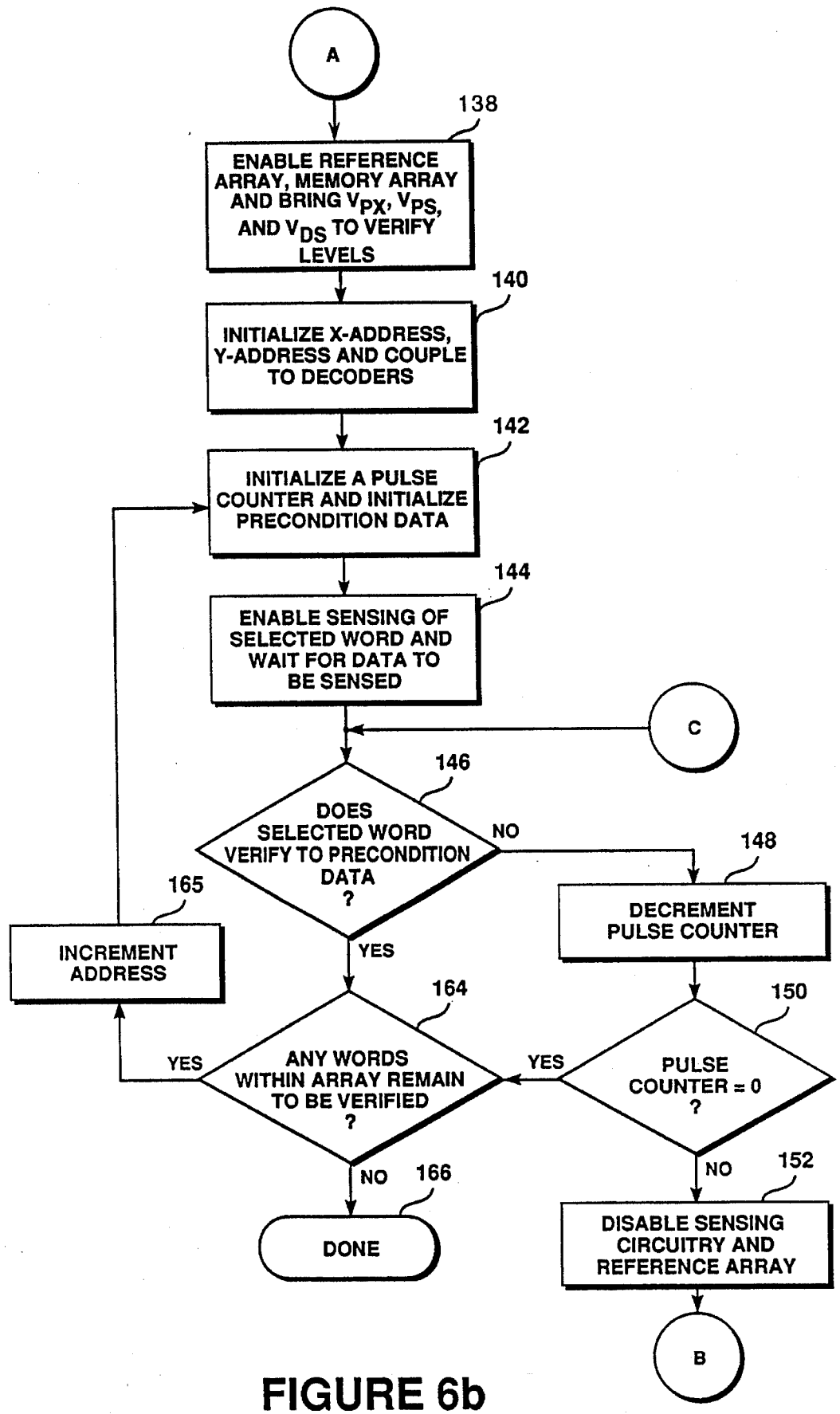
Figure 6C:
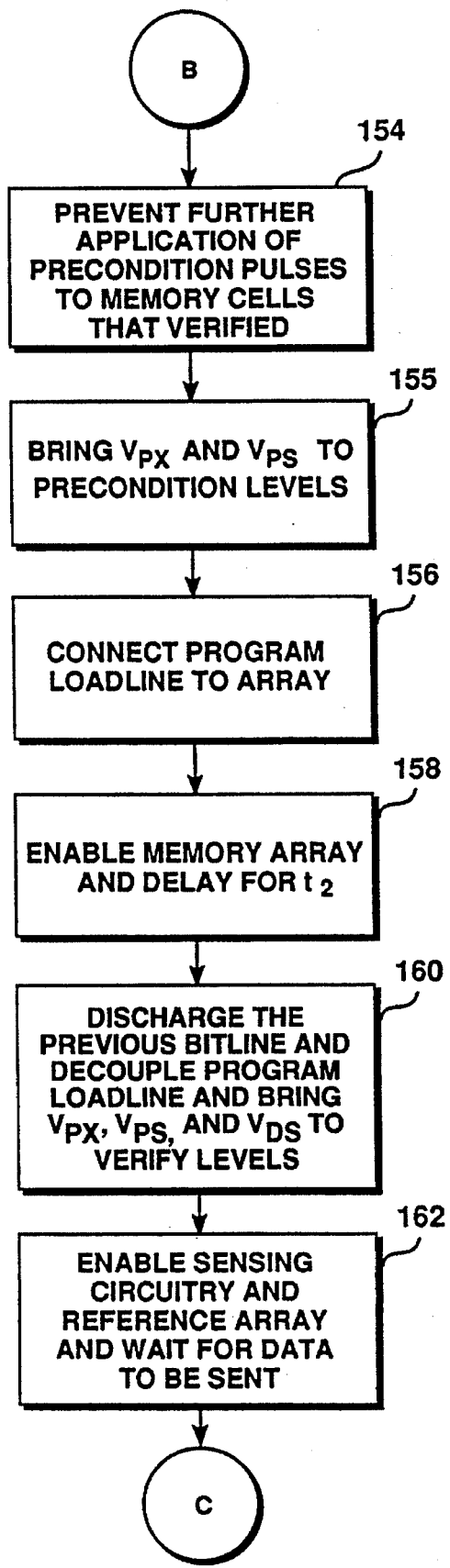

The flow diagram that is set forth in FIGS. 6a, 6b, and 6c illustrates in greater detail a method of preconditioning nonvolatile memory array 22 prior to erasure. For one embodiment, application of an initial precondition pulse to each memory cell to be preconditioned takes several steps for at least two reasons. First, the program loadline circuitry (not shown) associated with memory array 22 is only 16 bits wide and thus does not permit preconditioning of all memory cells within memory array 22 simultaneously. In other words, the program loadline circuitry can only precondition a word at a time. Nonetheless, much time is saved because $V_{PX}$, $V_{PS}$, and $V_{DS}$—which are applied to memory array 22—remain at precondition levels during the application of the initial precondition pulse to each of the memory cells within memory array 20. Second, protection of X decoder 28 and of the gate oxide within memory array 22 suggest that X addresses should not be changed while $V_{PX}$ is at its precondition level. This precaution may not be necessary for some X decoders and gate oxide fabrication processes.

As shown in FIG. 6a, control engine 36 prepares for the preconditioning of memory array 22 during step 120 by initializing the X address and the Y address. In other words, during step 120 control engine selects a wordline and a group of memory cells on the selected wordline. During step 120, control engine 36 also couples the signals representing the X address and Y address to X decoder 28 and Y decoder 30. Afterward, control engine 36 advances to state 122.

During step 122 control engine 36 brings $V_{PX}$ and $V_{PS}$ to precondition levels—i.e., $V_{PX}$ between 9–12 volts and $V_{PS}$ at ground. $V_{PX}$ is coupled to memory array 22 through X decoder 28. Control engine 36 then advances to step 124.

During step control 124, engine 36 couples the program loadline circuitry to memory array 22. Doing so brings $V_{DS}$ to its precondition level, approximately 5–7 volts; however $V_{DS}$ is not applied to memory array 22 until memory array 22 is enabled. At step 124 control engine 36 completes its preparations for applying an initial precondition pulse to the selected group of memory cells.

Control engine 36 begins application of the initial precondition pulse to each of the addressed memory cells in step 126 by enabling memory array 22. This couples $V_{DS}$ to memory array 22. The duration of the initial precondition pulse is controlled by subsequent states.

Control engine 36 branches to step 128 from step 126. Control engine 36 waits for a period of time, $t_1$, to expire during step 128. The duration of $t_1$ depends upon the selected duration of the initial precondition pulse reduced by the time required to execute either states 130 and 131 or states 130 and 133. In other words, $t_1$ should be chosen to account for the delay between the decision to stop the precondition pulse and stopping the precondition pulse, whichever states are executed. Control engine 36 advances to state 130 after the time period $t_1$ has elapsed.

At step 130, control engine 36 begins the process of selecting another group of memory cells to receive an initial precondition pulse. During step 130 control engine 36 determines whether all memory cells on the selected wordline (indicated by the X address) have been preconditioned. If not, only the Y address need be changed. This can be done without taking any precautions to protect memory array 22 or X decoder 28. Accordingly, control engine 36 branches to step 131 from step 130. During step 131 control engine 36 stops preconditioning of the addressed group of memory cells by grounding the bitlines of the addressed memory cells. Control engine 36 then increments the Y address during step 132. The X address is unchanged. Afterward, control engine 36 branches back to step 128 from step 132.

By repeatedly executing steps 128–132, control engine 36 steps through all the bitline addresses associated with the selected wordline and preconditions all the memory cells on the selected wordline. When each of the memory cells on the selected wordline has received an initial precondition pulse, selecting another group of memory cells for preconditioning requires selecting another wordline. For this situation, control engine 36 branches to step 133 from step 130. During state 133 control engine 36 stops the on-going precondition pulse by grounding the bitlines associated with the addressed memory cells. During step 133 control engine 36 also takes action to prevent changing the X address while $V_{PX}$ is at its precondition level. Thus, during step 133 control engine 36 decouples the program loadline circuitry from memory array 22 and disables memory array 22. Control engine 36 then brings $V_{PX}$ down from its precondition level to an intermediate voltage level. For one embodiment, 5 volts is chosen as the intermediate level. Control engine 36 then advances to step 134.

Control engine 36 increments the X address and initializes the Y address during step 134 thereby selecting the associated memory cells of another wordline to receive initial precondition pulses. Control engine 36 examines the X address during step 135 to determine if all the wordlines within memory array 22 have already received initial precondition pulses. If all wordlines have not received initial precondition pulses, control engine 36 branches from step 135 to step 136 to start preconditioning the memory cells associated with the selected wordline.

Control engine 36 brings $V_{PX}$ back to its precondition voltage level during step 136. Control engine 36 then returns to step 124 to recouple the program load line circuitry to memory array 22. Control engine 36 next enables memory array 22, coupling $V_{DS}$ to memory array 22 and beginning another precondition pulse to the group of the addressed memory cells. Control engine 36 then steps through steps 128–136.

Control engine 36 steps through steps 124, 126, 128, 130, 131, 132, 133, 134, 135, and 136 as appropriate until each of the memory cells within the memory array has received an initial precondition pulse. Step 135 is the decision step to see if any memory cell in memory array 22 has not received an initial precondition pulse. Once all the memory cells in the array 22 have each received an initial precondition pulse, control engine 36 branches from step 135 to step 138 and embarks upon precondition verification and the application of additional precondition pulses where necessary.

For alternative embodiments of the present invention, in place of steps 120 through 136, more than one memory word at a time would be preconditioned. For one alternative embodiment, an entire memory block would be preconditioned simultaneously before moving to step 138. For yet another alternative embodiment, an entire memory array comprised of two or more blocks would be preconditioned simultaneously before moving to step 138. For yet another alternative embodiment, a subblock would be preconditioned simultaneously before moving to step 138.

For an alternative embodiment, a portion of the memory array, such as a boot block, would not be preconditioned before moving to step 138, but the rest of the memory array would be preconditioned before moving to step 138. That preconditioning of the rest of the memory array would either be done at a word at a time or be done simultaneously.

Returning to the embodiment of the present invention shown in FIG. 6b, during step 138 control engine 36 brings $V_{PX}$, $V_{PS}$, and $V_{DS}$ to sensing levels, which are also referred to as precondition verify levels or verify levels. For one embodiment, $V_{PX}$ is set to approximately 5 volts, $V_{DS}$ to approximately 1.2 volts, and $V_{PS}$ to ground.

Control engine 36 begins precondition verification by initializing the X and Y addresses and coupling these address signals to decoders 28 and 30 during step 140. Preparations for precondition verification continue in step 142 with the initialization of a pulse counter and initialization of precondition data. For one embodiment of the present invention, the pulse counter is initialized to 255 (base 10). For other embodiments, other pulse counter initialization values are used. Control engine 36 monitors the pulse counter value and limits total precondition time by selecting another group of memory cells for precondition verification when the pulse counter reaches a selected value. The precondition pulse counter does not count individual precondition pulses. Instead, as shown in FIG. 6b, the precondition pulse counter is simply decremented at step 148 if a selected word does not verify as being correctly preconditioned. Thus, the precondition pulse counter is concerned with the memory word itself, not individual precondition pulses going to one or more memory cells of the memory word.

The precondition data is used by the sensing circuitry 32 to indicate the threshold voltage levels to which the selected group of memory cells should be preconditioned. The precondition data is initialized to 0000 (hexadecimal). The precondition data is modified after the initial verification operation to prevent applying another precondition pulse to a memory cell that verifies as preconditioned while other memory cells in the same group receive another precondition pulse. Control engine 36 advances to step 144 from step 142.

During step 144 control engine 36 configures memory device 20 to allow sensing of the addressed memory cells by coupling the reference array 34 and sensing circuitry 32 to memory array 22. Control engine 36 also allows sufficient time to elapse to enable the sensing circuitry 32 to sense the states of the addressed memory cells and to compare those states to the precondition data. Afterward, control engine 36 advances to step 146.

At step 146, control engine 36 determines whether all the addressed memory cells have been preconditioned by examining the output of sensing circuitry 32.

If all the addressed memory cells have not verified as being preconditioned, then control engine branches to step 148 from step 146 to determine if any additional precondition pulses will be applied. The value of the pulse counter is decremented during step 148. In the following step 150, control engine 36 examines the value of the pulse counter. Control engine 36 advances to step 152 if the value of the pulse counter is greater than zero.

For an alternative embodiment of the present invention, the present method is modified by initializing the pulse counter value to zero and then incrementing the count up to a maximum value to determine when the maximum number of pulses have been applied.

Returning to the embodiment shown in FIGS. 6b and 6c, during steps 152 through 162, control engine 36 prepares memory array 22 for the application of another precondition pulse. During state 152, control engine 36 decouples the sensing circuitry 32 and reference array 34 from memory array 22. In step 154, control engine 36 prevents the application of additional precondition pulses to those memory cells (of the addressed memory cells) that have verified as being appropriately preconditioned. Control engine 36 does this by appropriately modifying the precondition data. Modification of the precondition data means that control engine 36 no longer sends precondition pulses to those memory cells that have verified as being correctly preconditioned. For one embodiment, once a memory cell (within a selected word) verifies as being correctly preconditioned, even though the selected word itself does not verify, no additional preconditioning pulse is applied to that memory cell during each repetition of steps 154 through 162.

For one alternative embodiment, each addressed memory cell of a word is verified at step 146 and each cell that has shown itself in that particular step 146 to be not correctly preconditioned is given another preconditioning pulse at step 156. That alternative embodiment thus calls for applying an additional preconditioning pulse to a memory cell that correctly verified on a prior pass through step 146 but appears on the present pass through step 146 to be no longer correctly preconditioned. For yet another alternative embodiment, additional preconditioning pulses are applied to cells that have been correctly preconditioned and as well as to cells that have not been correctly preconditioned.

During step 155, control engine 36 brings $V_{PX}$ and $V_{PS}$ from verify voltage levels to precondition voltage levels.

During step 156, control engine 36 begins application of the precondition pulse or pulses by coupling the program loadline to memory array 22 (bringing $V_{DS}$ to its precondition level). During step 158, control engine 36 enables memory array 22 (coupling $V_{DS}$ to memory array 22). Control engine 36 allows a period of time $t_2$ to elapse before stopping the precondition pulse.

At step 160, control engine 36 discharges the previous bitline and decouples the program loadline. At step 160, control engine 36 brings $V_{PX}$, $V_{PS}$, and $V_{DS}$ to verify levels. Control engine 36 then moves to state 162. At step 162, control engine 36 enables sensing circuitry and the reference array. At step 162, control engine 36 waits for data to be sensed. By executing steps 158, 160, and 162, control engine 36 stops the application of the precondition pulse or pulses and changes memory device 20 from its precondition configuration to its precondition verify configuration.

From state 162 control engine 36 returns to step 146 to determine the success of the last precondition pulse or pulses in preconditioning the addressed memory cells.

Control engine 36 will step through steps 146, 148, 150, 152, 154, 155, 156, 158, 160, and 162 until a trigger event occurs—i.e., until the addressed memory cells verify as properly preconditioned or the pulse counter has been decremented to zero by the repetitive cycling through step 148. The pulse counter decrementing to zero means that the preselected maximum number of preconditioning cycles for the selected memory word has been achieved. Whichever event occurs first (i.e., either decrementing to zero or verification as correctly preconditioned), control engine 36 branches to step 164.

Thus, if verification has shown no correct preconditioning, but yet the maximum number of precondition pulse cycles have occurred, control engine 36 nevertheless branches to step 164. The assumption is that a failure to properly precondition after the repetition of the maximum number of precondition pulse cycles will generally not be fatal to the operation of memory device 20. For example, corrective action may be taken after a subsequent erasure.

Keep in mind, however, that there is a branch to step 164 if the verification step has shown proper preconditioning and the maximum number of preconditioning pulses has not been exceeded.

For an alternate embodiment, if the verification step shows that proper preconditioning has not been achieved, but yet the maximum number of preconditioning pulse cycles have been stepped through, then control engine 36 sends out a "preconditioning error" signal.

For yet another alternative embodiment, steps 148 and 150 of FIG. 6b are eliminated, and if at step 148 a selected word does not verify, then control engine 36 goes directly to step 152. Thus, for that alternative embodiment, control engine 36 steps through steps 146, 152, 154, 155, 156, 158, 160, and 162 until the addressed memory cells verify as being properly preconditioned, and there is no maximum number of precondition pulse cycles.

Returning to the embodiment shown in FIG. 6b, during step 164 control engine 36 determines whether any memory cells within memory array 22 remain to be precondition verified. This determination can be made by examining the X address and Y address.

If memory cells remain to be precondition verified, control engine 36 advances to step 165 to select another group of memory cells for precondition verification by incrementing the X address and Y address. Afterward, control engine 36 executes steps 142–162 as discussed previously. Eventually, all memory cells within memory array 22 will have been precondition verified and, its task complete, control engine 36 advances to state 166.

For an alternative embodiment, the method of FIG. 6a can be modified to apply initial precondition pulses on a bitline-by-bitline basis, rather than on a wordline-by-wordline basis.

For yet another alternative embodiment, X—Y scrambling and sequencing bitline ($V_{DS}$) and wordline ($V_{GS}$) voltages is used. For that alternative embodiment, X and Y addresses are scrambled and the column is successively preconditioned. Then successive columns are preconditioned.

Thus, in the foregoing detailed description a method of preconditioning the memory cells of a memory array has been described. The method described helps to reduce precondition time by applying an initial precondition pulse to each memory cell in the memory array prior to beginning precondition verification. This helps to reduce the time associated with slewing back and forth between precondition voltage levels and verify voltage levels.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for preconditioning selected memory cells of a memory array, comprising the steps of:

(a) applying an initial preconditioning pulse to each of the selected memory cells of the memory array to raise the threshold voltage of each of the selected memory cells, wherein one of the selected memory cells has been correctly preconditioned if the threshold voltage of that one of the selected memory cells has been raised above a predetermined voltage level;

(b) verifying whether a first group of cells of the selected memory cells have been correctly preconditioned;

(c) if the first group of cells of selected memory cells have not been correctly preconditioned, then applying preconditioning pulses to the first group of cells;

(d) verifying whether a second group of cells of the selected memory cells have been correctly preconditioned;

(e) if the second group of cells of selected memory cells have not been correctly preconditioned, then applying preconditioning pulses to the second group of cells.

2. The method of claim 1 for preconditioning, wherein the selected memory cells comprise a portion of the memory array.

3. The method of claim 1 for preconditioning, wherein the selected memory cells comprise all of the memory array.

4. A method for preconditioning memory cells of a memory array, comprising the steps of:

(a) applying an initial preconditioning pulse to each of the memory cells of the memory array to raise the threshold voltage of each of the memory cells, wherein one of the memory cells has been correctly preconditioned if the threshold voltage of that one of the memory cells has been raised above a predetermined voltage level;

(b) verifying whether each of the memory cells of a first group of memory cells of the memory array has been correctly preconditioned;

(c) if any memory cell of the first group of memory cells has not been correctly preconditioned, then applying another preconditioning pulse to each memory cell of the first group of memory cells that has not been correctly preconditioned;

(d) verifying whether each of the memory cells of a second group of memory cells of the memory array has been correctly preconditioned;

(e) if any memory cell of the second group of memory cells has not be correctly preconditioned, then applying another preconditioning pulse to each memory cell of the second group of memory cells that has not been correctly preconditioned.

5. A method for preconditioning memory cells of a memory array, comprising the steps of:

(a) applying an initial preconditioning pulse to each of the memory cells of the memory array to raise the threshold voltage of each of the memory cells, wherein one of the memory cells has been correctly preconditioned if the threshold voltage of that one of the memory cells has been raised above a predetermined voltage level;

(b) verifying whether each of the memory cells of a first group of memory cells of the memory array has been correctly preconditioned;

(c) if any memory cell of the first group of memory cells has not been correctly preconditioned, then applying another preconditioning pulse to each memory cell of the first group of memory cells that has not been correctly preconditioned;

(d) repeating steps (b) and (c) above until each of the first group of memory cells has been verified to be correctly preconditioned or a maximum number Of verifications of each of the memory cells within the first group of memory of occur;

(e) verifying whether each of the memory cells of a second group of memory cells of the memory array has been correctly preconditioned;

(f) if any memory cell of the second group of memory cells has not been correctly preconditioned, then applying another preconditioning pulse to each memory cell of the second group of memory cells that has not been correctly preconditioned;

(g) repeating steps (e) and (f) above until each of the second group of memory cells has been verified to be correctly preconditioned, or a maximum number of verifications of each of the memory cells of the second group of memory cells occur.

6. The method of claim 5 for preconditioning, wherein the memory array is a nonvolatile memory array.

7. A method for preconditioning selected memory cells of a memory array, comprising the steps of:

(a) applying an initial preconditioning pulse to each of the selected memory cells of the memory array to raise the threshold voltage of each of the selected memory cells, wherein one of the selected memory cells has been correctly preconditioned if the threshold voltage of that one of the selected memory cells has been raised above a predetermined voltage level;

(b) verifying whether first and second groups of the selected memory cells have been correctly preconditioned;

(c) if the first group of selected memory cells has not been correctly preconditioned, then applying preconditioning pulses to the first group;

(d) if the second group of selected memory cells has not been correctly preconditioned, then applying preconditioning pulses to the second group.

8. The method of claim 7 for preconditioning, further comprising the step of storing in a scratch pad memory results of verifying whether first and second groups of the selected memory cells have been correctly preconditioned.

* * * * *

UNITED STATES PATENT AND TRADEMARK OFFICE
CERTIFICATE OF CORRECTION

| | | |
|---|---|---|
| PATENT NO. | : | 5,537,357 |
| DATED | : | July 16, 1996 |
| INVENTOR(S) | : | Merchant et al. |

It is certified that error appears in the above-identified patent and that said Letters Patent is hereby corrected as shown below:

In column 5, at line 14, delete "stewing" and substitute
--slewing--

Signed and Sealed this

Eighth Day of October, 1996

Attest:

BRUCE LEHMAN

*Attesting Officer*    *Commissioner of Patents and Trademarks*